(12) United States Patent
Anderson et al.

(10) Patent No.: US 7,091,551 B1
(45) Date of Patent: Aug. 15, 2006

(54) FOUR-BIT FINFET NVRAM MEMORY DEVICE

(75) Inventors: Brent A. Anderson, Jericho, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,712

(22) Filed: Apr. 13, 2005

(51) Int. Cl.
*H01L 29/788* (2006.01)

(52) U.S. Cl. ............... 257/324; 438/954; 438/283

(58) Field of Classification Search ............... 257/324; 438/257–267, 283
See application file for complete search history.

(56) References Cited

U.S. PATENT DOCUMENTS

| 6,735,124 | B1 | 5/2004 | Melik-Martirosian et al. |
| 6,963,104 | B1 * | 11/2005 | Wu et al. ............ 257/315 |
| 2003/0042531 | A1 | 3/2003 | Lee et al. |
| 2003/0123303 | A1 | 7/2003 | Kamei |
| 2004/0014289 | A1 | 1/2004 | Woo |
| 2004/0070026 | A1 | 4/2004 | Kamigaki et al. |
| 2004/0164359 | A1 | 8/2004 | Iwata et al. |
| 2006/0097310 | A1 * | 5/2006 | Kim et al. ............ 257/321 |
| 2006/0115978 | * | 6/2006 | Specht et al. ............ 438/637 |

FOREIGN PATENT DOCUMENTS

JP          5291583          11/1993

OTHER PUBLICATIONS

Alberts et al.; Multi-Bit Fet EAROM Cell; IBM Technical Disclosure Bulletin, vol. 24, No. 7A, Dec. 1981; pp. 3311-3314.

* cited by examiner

*Primary Examiner*—Richard A. Booth
(74) *Attorney, Agent, or Firm*—Schmeiser, Olsen & Watts; William D. Sabo

(57) ABSTRACT

A four-bit FinFET memory cell, method of fabricating four-bit FinFET memory cell and an NVRAM formed of four-bit FINFET memory cells. The four-bit memory cell including two charge storage regions in opposite ends of a dielectric layer on a first sidewall of a fin of a FinFET and two additional charge storage regions in opposite ends of a dielectric layer on a second sidewall of the fin of the FinFET, the first and second sidewalls being opposite one another.

22 Claims, 10 Drawing Sheets

FOUR-BIT FINFET NVRAM MEMORY DEVICE

FIELD OF THE INVENTION

The present invention relates to the field of FinFET memory devices; more specifically, it relates to a FinFET device capable of storing four independent bit values, a method of fabricating the FinFET device and a flash memory array using the FinFET device.

BACKGROUND OF THE INVENTION

The need to remain cost and performance competitive in the production of semiconductor devices has caused increasing device density in integrated circuits in order to increase the bits per unit area ratio. As physical density increases become ever more expensive and difficult to accomplish, new ways of increasing the number of bits a memory cell device can store without further increasing device density have been proposed. Therefore, there is an ongoing need for ever more efficient ways of increasing device density and for increasing bit counts per memory cell device.

SUMMARY OF THE INVENTION

The present invention forms two charge storage regions in a dielectric layer on a first sidewall of a fin of a FinFET and two additional charge storage regions in a dielectric layer on a second sidewall of the fin, the first and second sidewalls being opposite of another.

A first aspect of the present invention is a semiconductor device, comprising: a fin body having opposite first and second ends and opposite first and second sidewalls, the first and second sidewalls disposed between the first and second ends; a first gate dielectric stack disposed on the first sidewall and a second gate dielectric stack disposed on the second sidewall, the first and second stacks each comprising at least a first, a second and a third dielectric layer, the first dielectric layer of the first dielectric stack in direct physical contact with the first sidewall and the first dielectric layer of the second dielectric stack in direct physical contact with the second sidewall; a first gate electrode in direct physical contact with the third dielectric layer of the first gate dielectric stack and a second gate electrode in direct physical contact with the third dielectric layer of the second gate dielectric stack, the first and second gate electrodes not in direct physical contact with each other; a first source/drain in the first end of the fin body and a second source/drain in the second end of the fin body; and a channel region in the fin body between the first and second source/drains and aligned between the first and second gate electrodes.

A second aspect of the present invention is a method of fabricating a semiconductor device, comprising: providing a silicon layer on top surface of an insulation layer of a substrate; forming a fin body from the silicon layer, the fin body having opposite first and second ends and opposite first and second sidewalls, the first and second sidewalls disposed between the first and second ends; forming a first gate dielectric stack on the first sidewall and a second gate dielectric stack on the second sidewall, the first and second stacks each comprising at least a first, a second and a third dielectric layer, the first dielectric layer of the first dielectric stack in direct physical contact with the first sidewall and the first dielectric layer of the second dielectric stack in direct physical contact with the second sidewall; forming a first gate electrode in direct physical contact with the third dielectric layer of the first gate dielectric stack and a second gate electrode in direct physical contact with the third dielectric layer of the second gate dielectric stack, the first and second gate electrodes not in direct physical contact with each other; and forming a first source/drain in the first end of the fin body and a second source/drain in the second end of the fin body, the first and second source/drain regions separated by a channel region in the fin body and aligned between the first and second gate electrodes.

A third aspect of the present invention is an NVRAM memory, comprising: an array of four-bit memory cells arranged in rows and columns, each 4-bit memory cell comprising: a fin body having opposite first and second ends and opposite first and second sidewalls, the first and second sidewalls disposed between the first and second ends; a first gate dielectric stack disposed on the first sidewall and a second gate dielectric stack disposed on the second sidewall, the first and second stacks each comprising at least a first, a second and a third dielectric layer, the first dielectric layer of the first dielectric stack in direct physical contact with the first sidewall and the first dielectric layer of the second dielectric stack in direct physical contact with the second sidewall; a first gate electrode in direct physical contact with the third dielectric layer of the first gate dielectric stack and a second gate electrode in direct physical contact with the third dielectric layer of the second gate dielectric stack, the first and second gate electrodes not in direct physical contact with each other; a first source/drain in the first end of the fin body and a second source/drain in the second end of the fin body; and a channel region in the fin body between the first and second source/drains and aligned between the first and second gate electrodes; a first wordline connected to each first gate electrode and a second wordline connected to each second gate electrode of each four-bit memory cell in a same row of four-bit memory cells of the array of four-bit memory cells; and a first bitline connected to each first source/drain and a second bitline connected to each second source/drain of each four-bit memory cell in a same column of four-bit memory cells of the array of four-bit memory cells.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
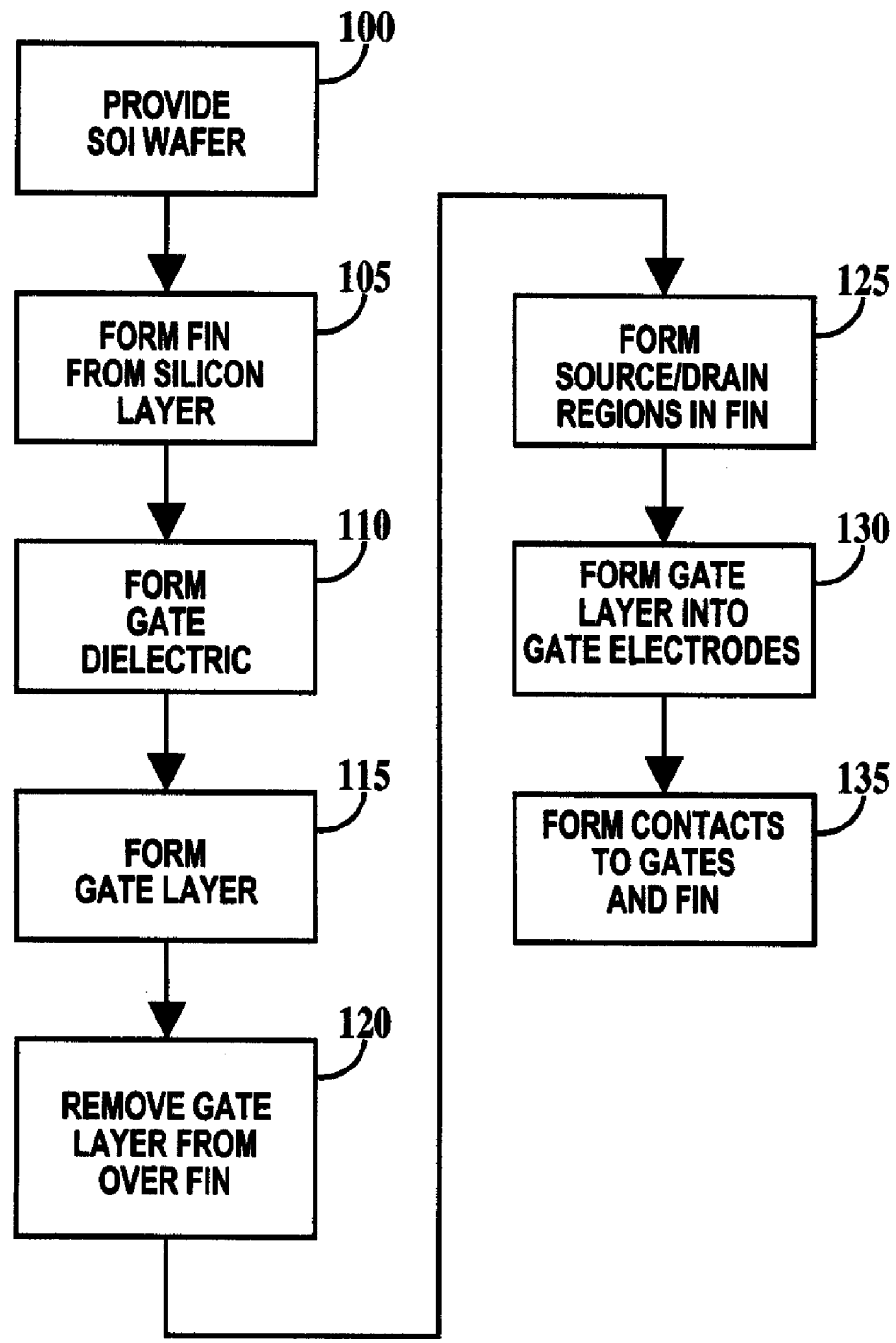
FIG. 1 is flowchart of an exemplary method of fabricating a four-bit FinFET device according to the present invention.

FIG. 1 is flowchart of an exemplary method of fabricating a four-bit FinFET device according to the present invention. In step 100, a silicon-on-insulator (SOI) substrate is provided and in step 105, a silicon fin is formed from the silicon layer of the SOI substrate. Steps 100 and 105 are illustrated in FIGS. 2A through 2F and described in more detail infra.

Figure 3:
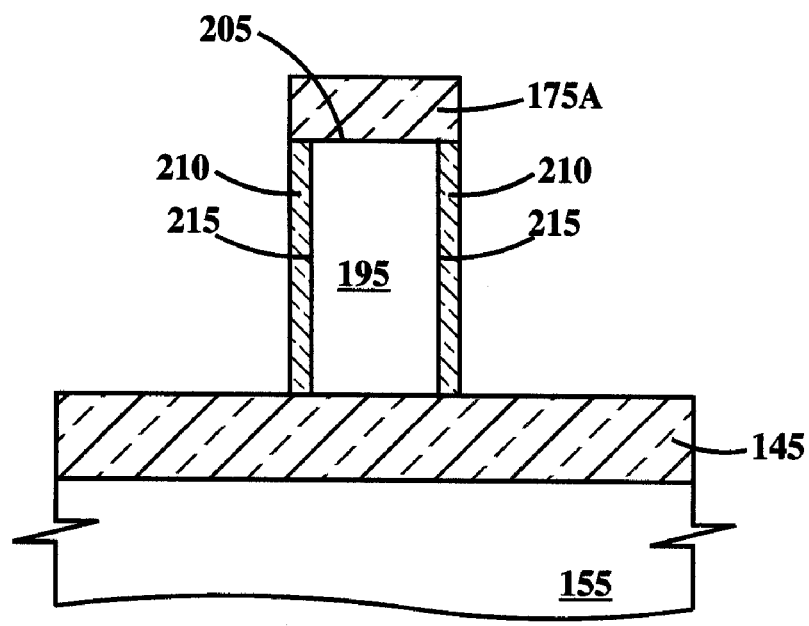
FIGS. 3 through 6 are partial cross-sectional drawings illustrating additional steps for fabricating the four-bit FinFET device of the present invention.
Figure 4:
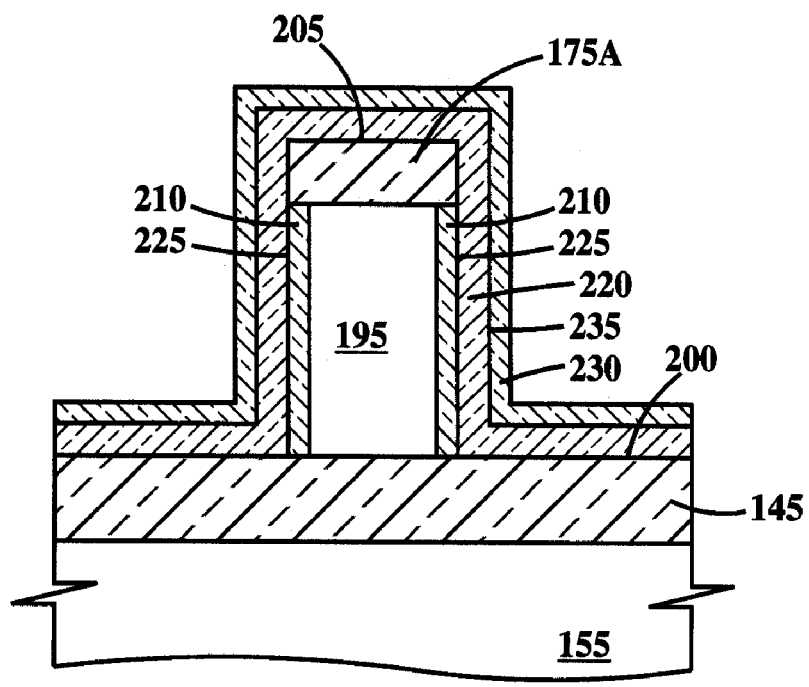

In step 110, a multi-layer gate dielectric stack is formed on opposite sides of the silicon fin. The multi-layer gate dielectric stack comprises three distinct dielectric layers. The dielectric layer in contact with the silicon fin may also be referred to as a tunneling gate dielectric layer. The inner dielectric layer of the multi-layer gate dielectric stack may be referred to a charge storing dielectric layer (i.e. a dielectric layer capable of storing either a negative or positive charge formed by application of a voltage across the chargeable dielectric layer and from which the charge can be removed by application of a reverse polarity voltage across the charge storing dielectric layer). Step 110 is illustrated in FIGS. 3 and 4 and described in more detail infra.

Figure 5:
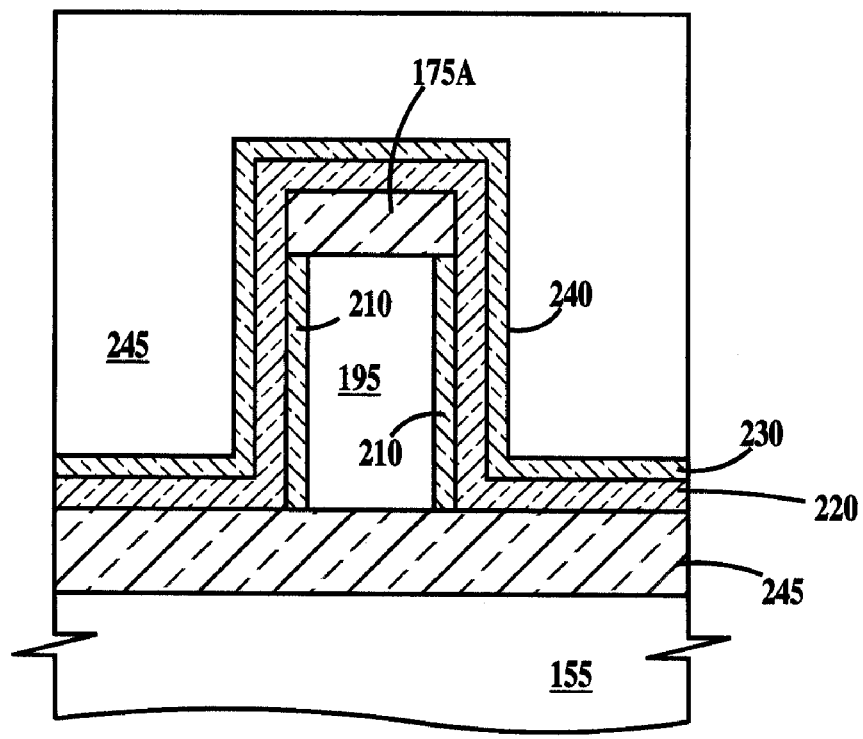
Figure 6:
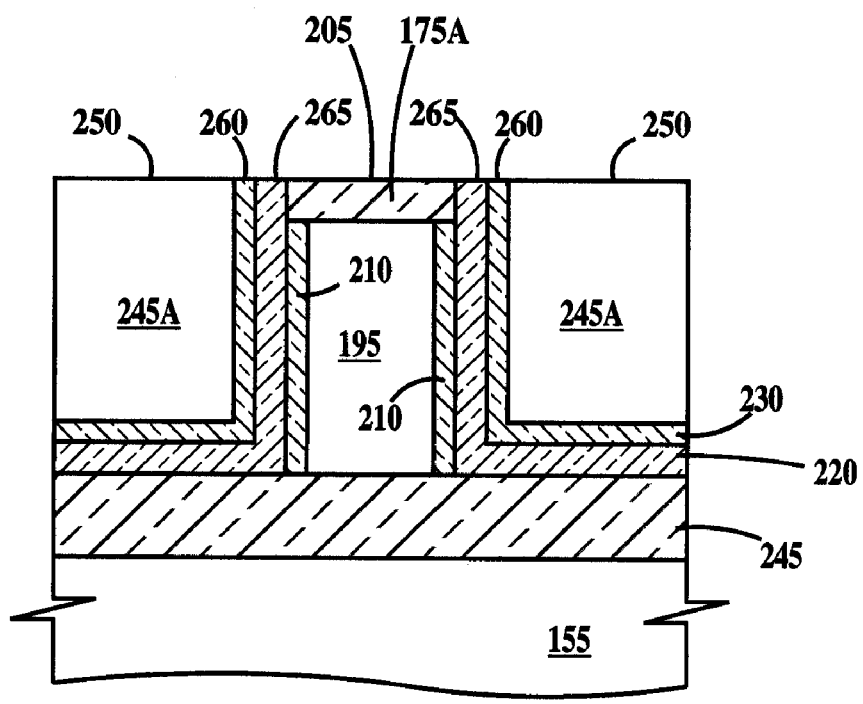

In step 115, a gate layer is formed over the silicon fin and in step 120, particularly on the sidewalls of the fin, and the gate layer is removed from over the silicon fin. Steps 115 and 120 are illustrated in FIGS. 5 and 6 and described in more detail infra.

Figure 7:
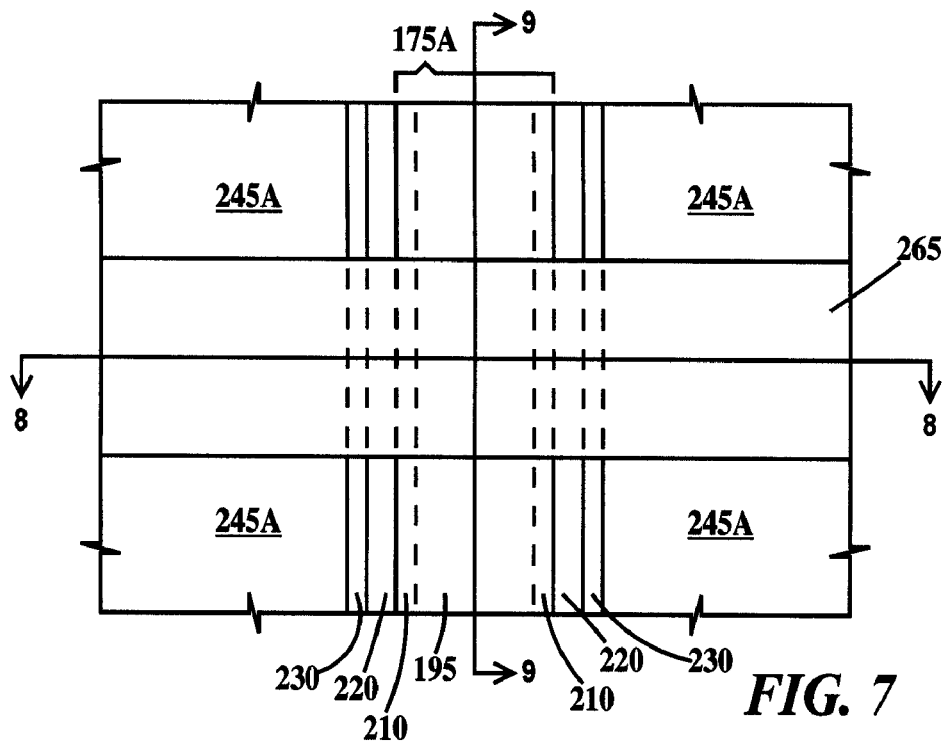
FIG. 7 is a top view and FIGS. 8 and 9 are cross-sectional views through lines 8—8 and 9—9 respectively of FIG. 7 illustrating the additional step of forming doped regions in the fin portion of the four-bit FinFET device of the present invention.
Figure 8:
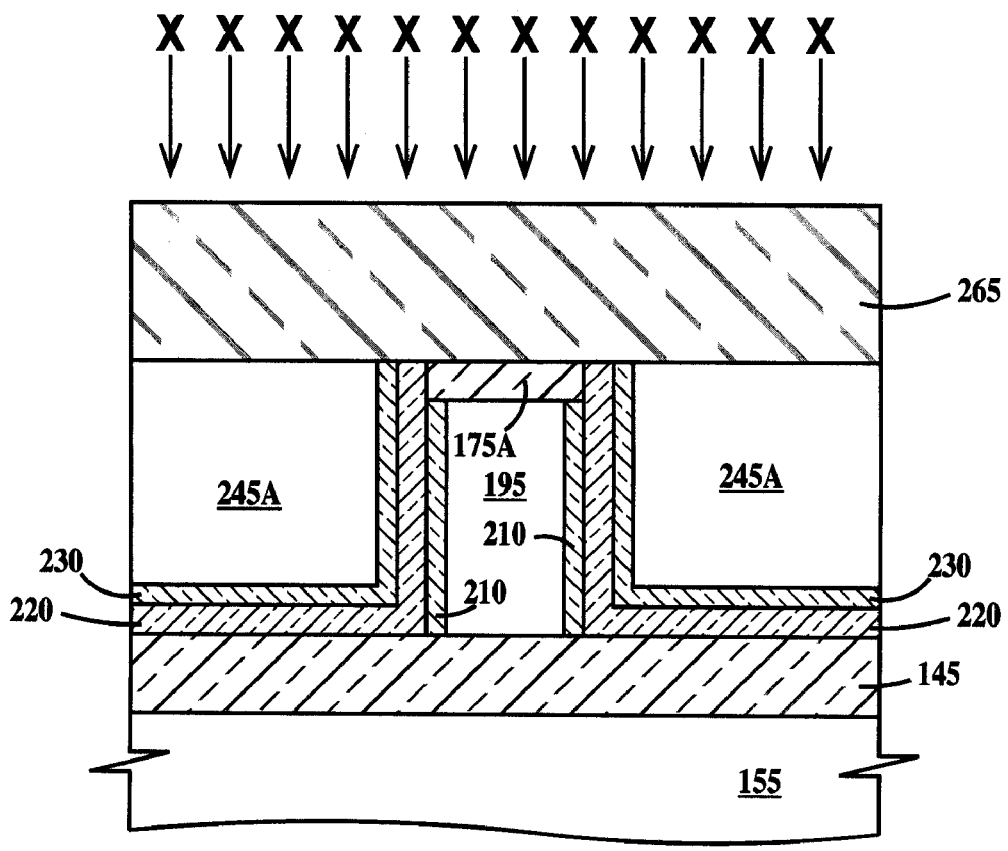
Figure 9:
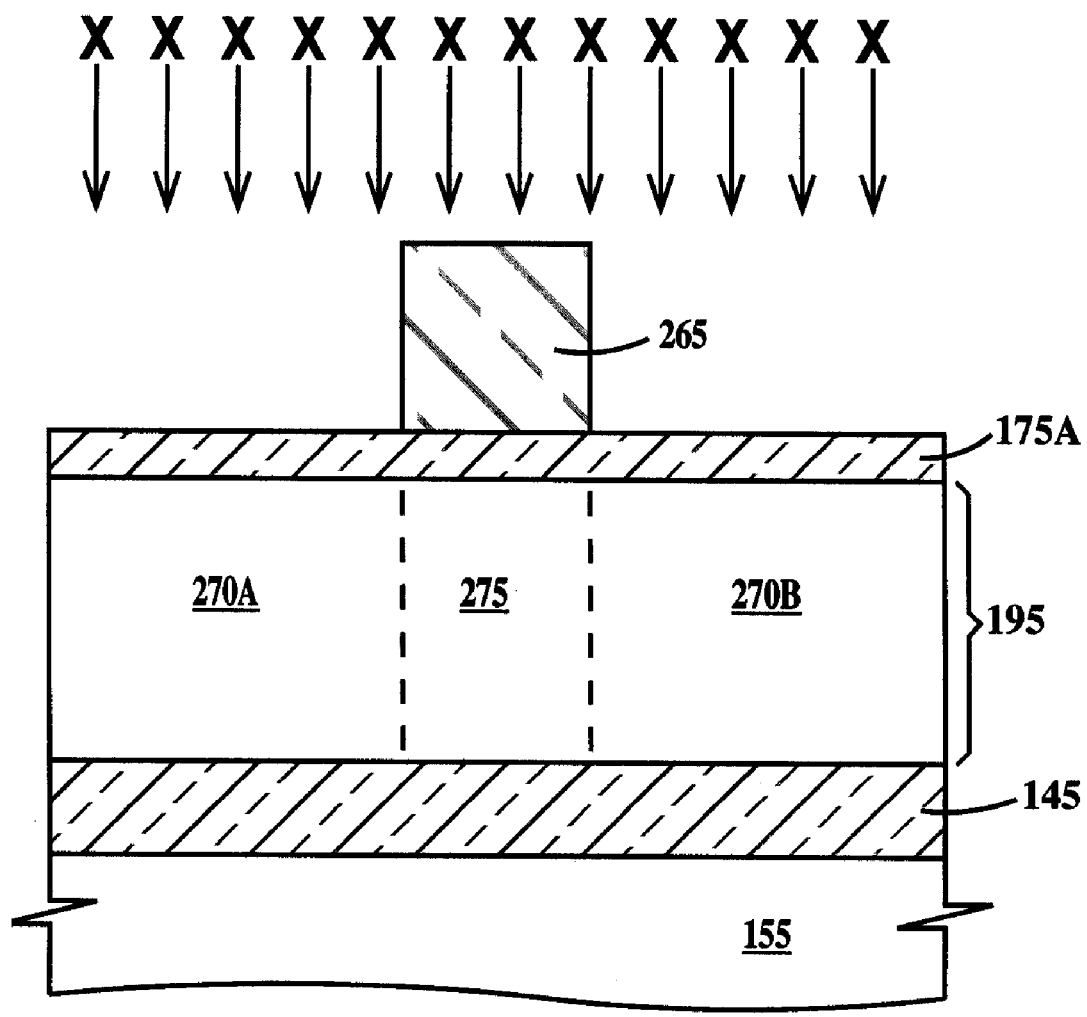

In step 125, source/drain regions are formed in opposite ends of the silicon fin, separated by a channel region. Formation of source/drain regions are illustrated in FIGS. 7 through 9 and described in more detail infra.

Figure 10:
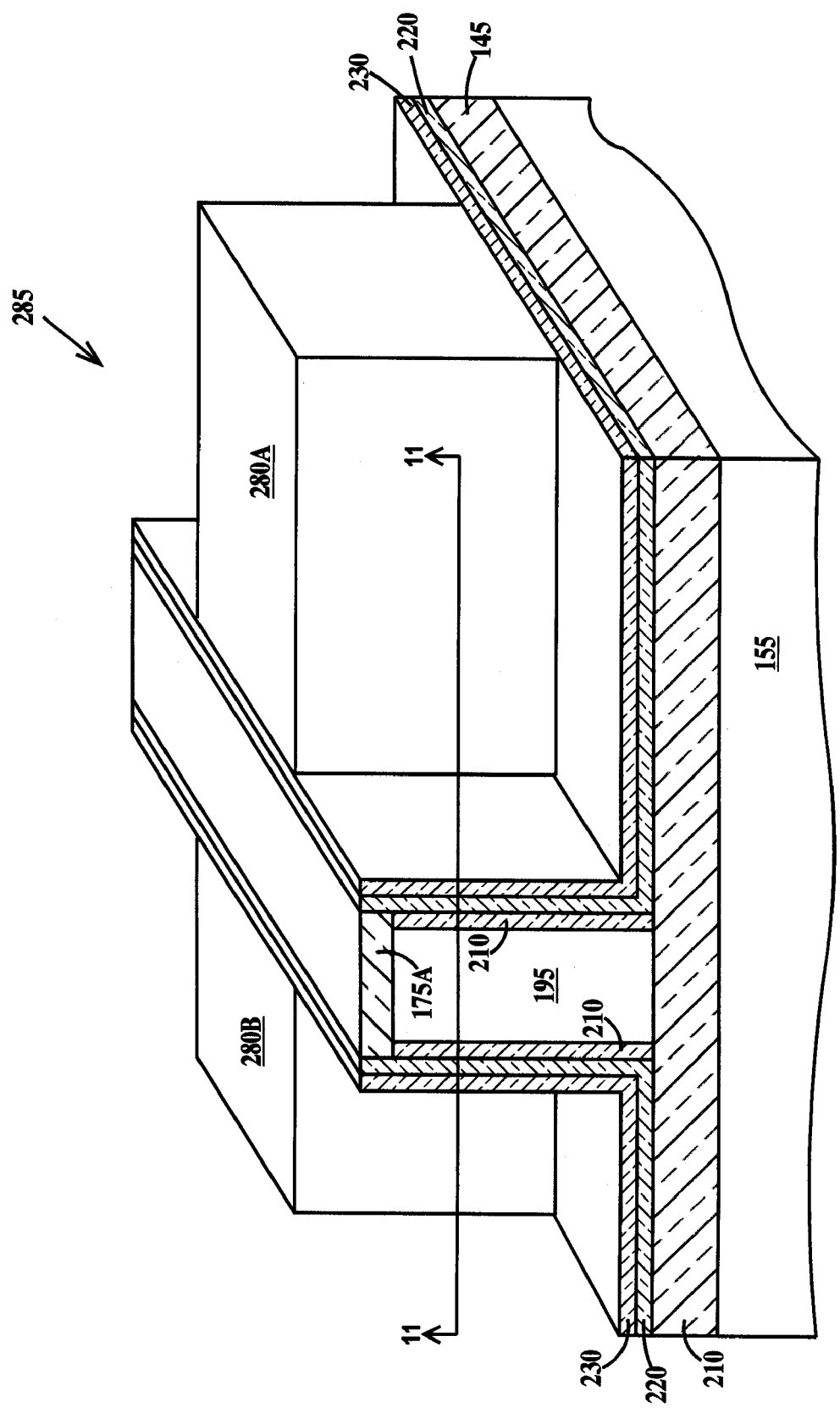
FIG. 10 is an isometric view illustrating the additional step of forming the gate electrodes of the four-bit FinFET device of the present invention.

In step 130, the gate layer is etched to form two electrically un-connected gate electrodes on opposite sidewalls of the silicon fin and aligned between the source/drain regions previously formed in the silicon fin. The now essentially completed four-bit FinFET device is illustrated in FIG. 10 and described in more detail infra.

In step 135, contacts are formed to the source/drains and gates and wires connected to the contacts to interconnect the four-bit FinFET as a cell of a memory array. An exemplary memory array using four-bit FinFETs is illustrated in FIG. 12.

Figure 2A:
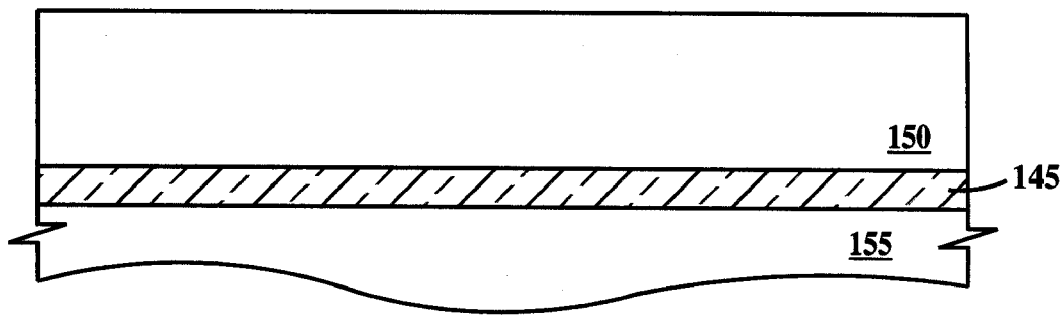
FIGS. 2A through 2F are partial cross-sectional drawings illustrating an exemplary method for fabricating a silicon fin portion of the four-bit FinFET device of the present invention.

FIGS. 2A through 2F are partial cross-sectional drawings illustrating an exemplary method for fabricating a silicon fin portion of the four-bit FinFET device of the present invention. In FIG. 2A, an SOI substrate comprises a buried dielectric layer 145 separating a overlaying single-crystal silicon layer 150 from an underlying substrate 155. In one example, buried dielectric layer 145 comprises a buried oxide (BOX) such silicon dioxide. In one example, substrate 155 comprises single crystal silicon. Silicon layer 150 may be intrinsic, doped N-type or doped P type.

Figure 2B:
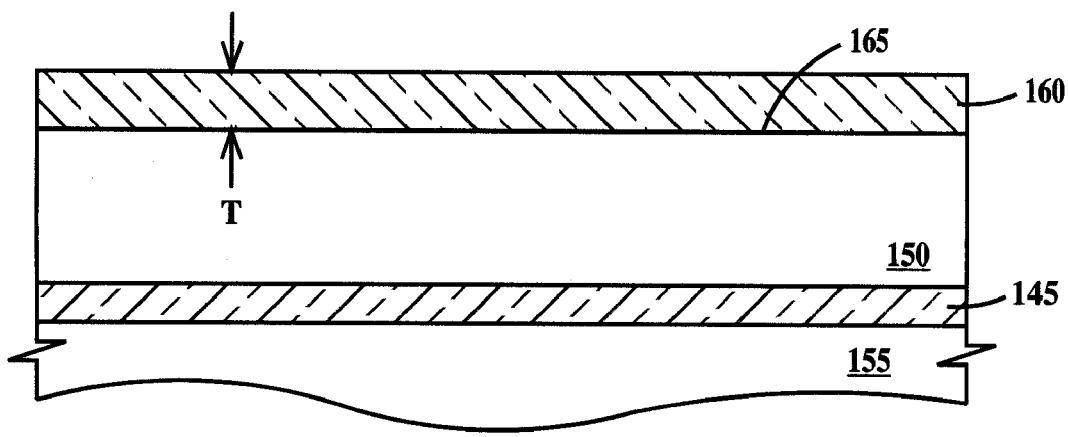

FIGS. 2B through 2F illustrate a technique of forming fins of a FinFET by a process known as sidewall transfer. In FIG. 2B, a hard mask layer 160 is formed on a top surface 165 of silicon layer 150. In one example, hard mask layer 160 comprises silicon dioxide formed, for example by a chemical vapor deposition (CVD) process. Hard mask layer has a thickness T and acts as a chemical-mechanical-polish (CMP) stop in the process described infra in reference to FIG. 6.

Figure 2C:
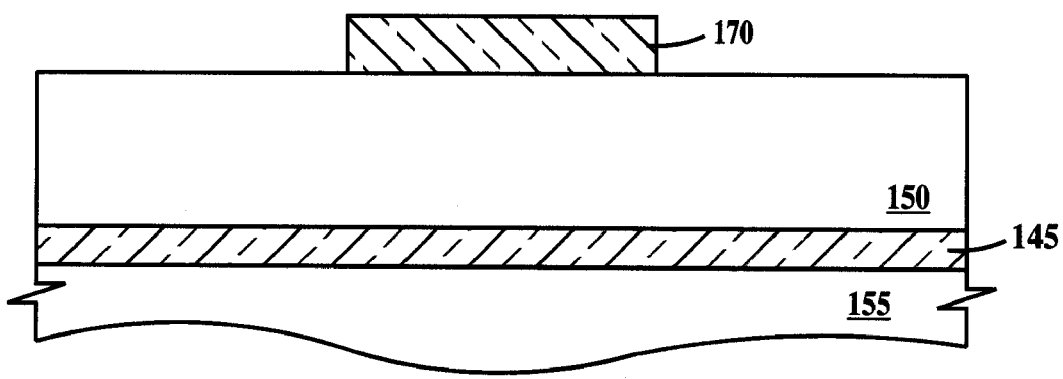

In FIG. 2C, a photolithographic process is used to pattern a photoresist layer (not shown) which is used as a mask for etching hard mask layer 160 of FIG. 2B into an island 170, followed by removal of the photoresist layer. In one example, with hard mask layer 160 (see FIG. 2B) comprising silicon dioxide, the etch process is a reactive ion etch (RIE) selective to silicon dioxide over silicon (that is, preferentially etching silicon dioxide at a faster rate than silicon)

Figure 2D:
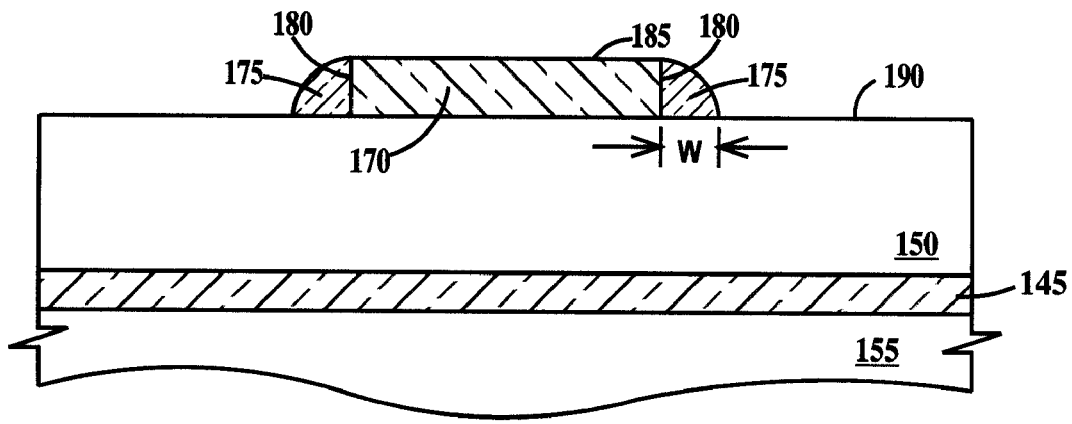

In FIG. 2D, spacers 175 are formed on sidewalls 180 of island 170. Spacers 175 may be formed by deposition of a conformal layer, for example by CVD, followed by a direction RIE to remove the conformal layer from a top surface 185 of island 170 and top surface 190 of silicon layer 150. The width W of spacers 175 can be controlled by adjustment of the thickness T of hard mask layer 160 (see FIG. 2B) from which island 170 was formed, the thickness of the conformal layer deposited from which spacers 175 where formed, and the RIE etch time and process conditions. In one example, spacers 175 comprise silicon nitride.

Figure 2E:
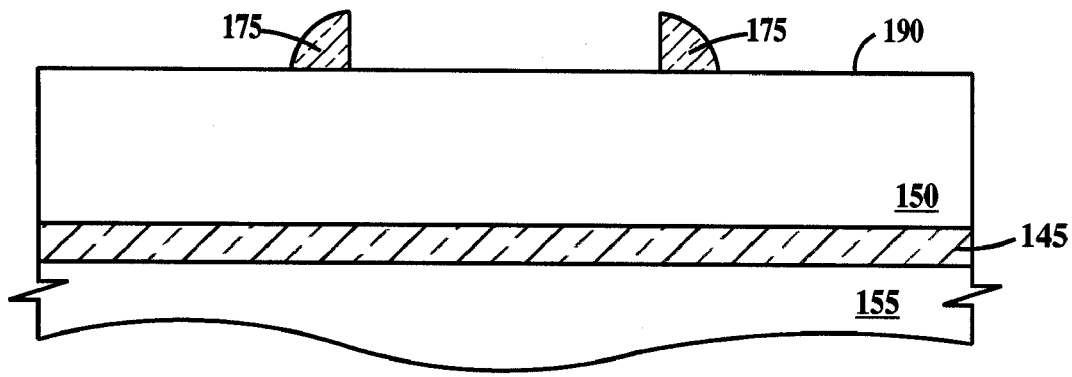

In FIG. 2E, island 170 (see FIG. 2D) is removed, for example by an RIE process selective to silicon dioxide over silicon and silicon nitride. A thin layer of thermal oxide may be grown on exposed top surface 190 of silicon layer 150 prior to the etch operation to enhance the selectivity.

Figure 2F:
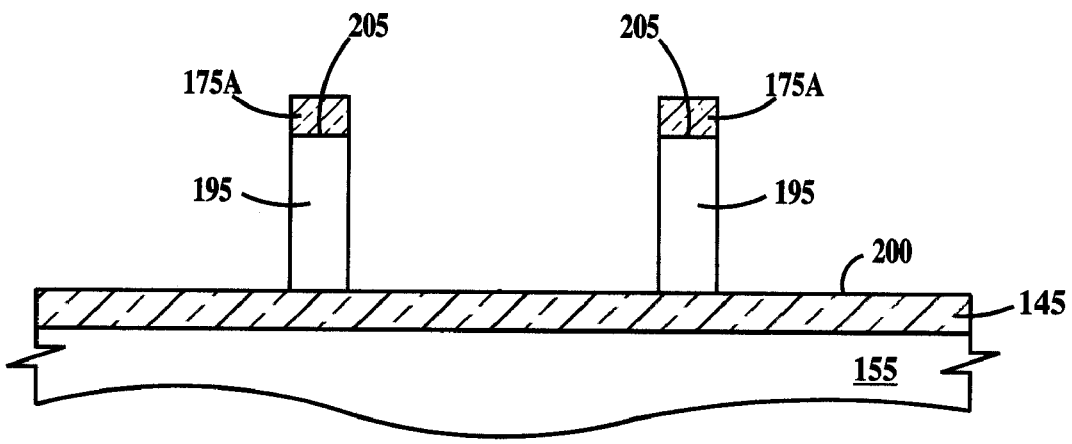

In FIG. 2F, fins 195 are formed on top surface 200 of buried dielectric layer 145 by, for example when spacers 175 comprise silicon nitride, an RIE process selective to silicon over silicon nitride. Some etching of spacers 175 (see FIG. 2E) to form dielectric caps 175A on top surfaces 205 of fins 195 may occur.

In another example, a structure similar to that depicted in FIG. 2F may be formed by forming a first layer on top surface of an the upper silicon layer of an SOI substrate, forming a second layer on top of the first layer, etching the second to form islands, undercutting the second layer under the islands, etching the silicon layer to form fins and removing the island, but not the remaining first layer on top of the fin.

FIGS. 3 through 6 are partial cross-sectional drawings illustrating additional steps for fabricating the four-bit Fin-FET device of the present invention. In FIG. 3, a first gate dielectric layer 210 is formed on sidewalls 215 of fin 195. In one example, first gate dielectric layer 210 comprises thermal silicon dioxide and is between about 35 Å to about 105 Å thick. In a second example (not illustrated), first gate dielectric layer may be formed by deposition, in which case the first dielectric layer will be formed on exposed surfaces of dielectric cap 175A as well.

In FIG. 4, a second gate dielectric layer 220 is formed on a top surface 225 of first dielectric layer 210 and exposed surfaces (including top surface 205) of dielectric cap layer 175A. In one example, second gate dielectric layer 220 comprises CVD silicon nitride and is between about 75 Å to about 225 Å thick. A third gate dielectric layer 230 is formed on a top surface 235 of second gate dielectric layer 220. In one example, third gate dielectric layer 230 comprises CVD silicon dioxide and is between about 25 Å to about 75 Å thick. First and third gate dielectric layers 220 and 230 may independently comprise high K (where K is the dielectric constant) dielectric materials, where a high K dielectric material has a relative permittivity above 10. First and third gate dielectric layers 220 and 230 may independently comprise high K dielectric materials in combination with silicon dioxide. Examples of high K dielectric materials include but are not limited metal oxides such as $Ta_2O_5$, $BaTiO_3$, $HfO_2$, $ZrO_2$, $Al_2O_3$, or metal silicates such as $HfSi_xO_y$, or $HfSi_x$-

$O_yN_z$ or combinations thereof. Second gate dielectric layer 220 is the "chargeable dielectric" mentioned supra in reference to step 115 of FIG. 1.

In FIG. 5, a CVD polysilicon layer 245 is formed on a top surface 240 of third gate dielectric layer 230. In one example, polysilicon layer 245 is thicker than the thickness of fin 195 and dielectric cap 175A combined. In a first example, polysilicon layer 245 is undoped. In a second example, polysilicon layer 245 is doped N-type if the completed FinFET is to be a N-channel FinFET (FinNFET). In a third example, polysilicon layer 245 is doped P-type if the completed FinFET is to be a P-Channel (FinPFET).

In FIG. 6, a CMP process is performed to thin polysilicon layer 245 of FIG. 5, such that top surface 205 of dielectric cap 175A is coplanar with a top surface 250 of a polysilicon layer 245A and coplanar with exposed ends 265 and 260 of second and third gate dielectric layers 220 and 230 respectively.

FIG. 7 is a top view and FIGS. 8 and 9 are cross-sectional views through lines 8—8 and 9—9 respectively of FIG. 7 illustrating the additional step of forming doped regions in the fin portion of the four-bit FinFET device of the present invention. In FIGS. 7, 8 and 9, a patterned photo resist layer 265 is formed perpendicular to fin 195 on top of capping layer 175A, and any exposed second and third gate dielectric layer 220 and 230. Then an ion implantation is performed of species X. Photoresist layer 265 is of sufficient thickness to stop any species X from penetrating into polysilicon layer 245A. However, as seen in FIG. 9, wherever there is no photoresist layer 265, species X penetrates into fin 195 forming first and second source/drain (S/D) regions 270A and 270B respectively, in fin 195. In a first example, species X comprises an N-dopant species if the completed FinFET is to be a FinNFET. In a second example, species X comprise a P-dopant species if the completed FinFET is to be a FinPFET. Since photoresist layer 265 will also be used as mask to etch silicon layer 245A to form gate electrodes, a channel region 275 is defined between S/D regions 270A and 270B.

FIG. 10 is an isometric view after the additional step of forming the gate electrodes of the four-bit FinFET device of the present invention. In FIG. 10, a polysilicon etch (for example a RIE selective silicon to silicon dioxide and silicon nitride) has been performed using photoresist layer 265 (see FIGS. 7, 8 and 9) to form a first gate electrode 280A and a second gate electrode 280B wherever silicon layer 245A (see FIGS. 7, 8 and 9) was not protected by the photoresist layer, and the photoresist layer then removed. Note, additional masking and etching steps may be required to cut through fin 195, cap dielectric layer 175A, first, second and third gate dielectric layers 210, 220 and 230 to separate individual or groups of FinFETs from one another. Fabrication of a four-bit FinFET 285 is now complete.

Figure 11:
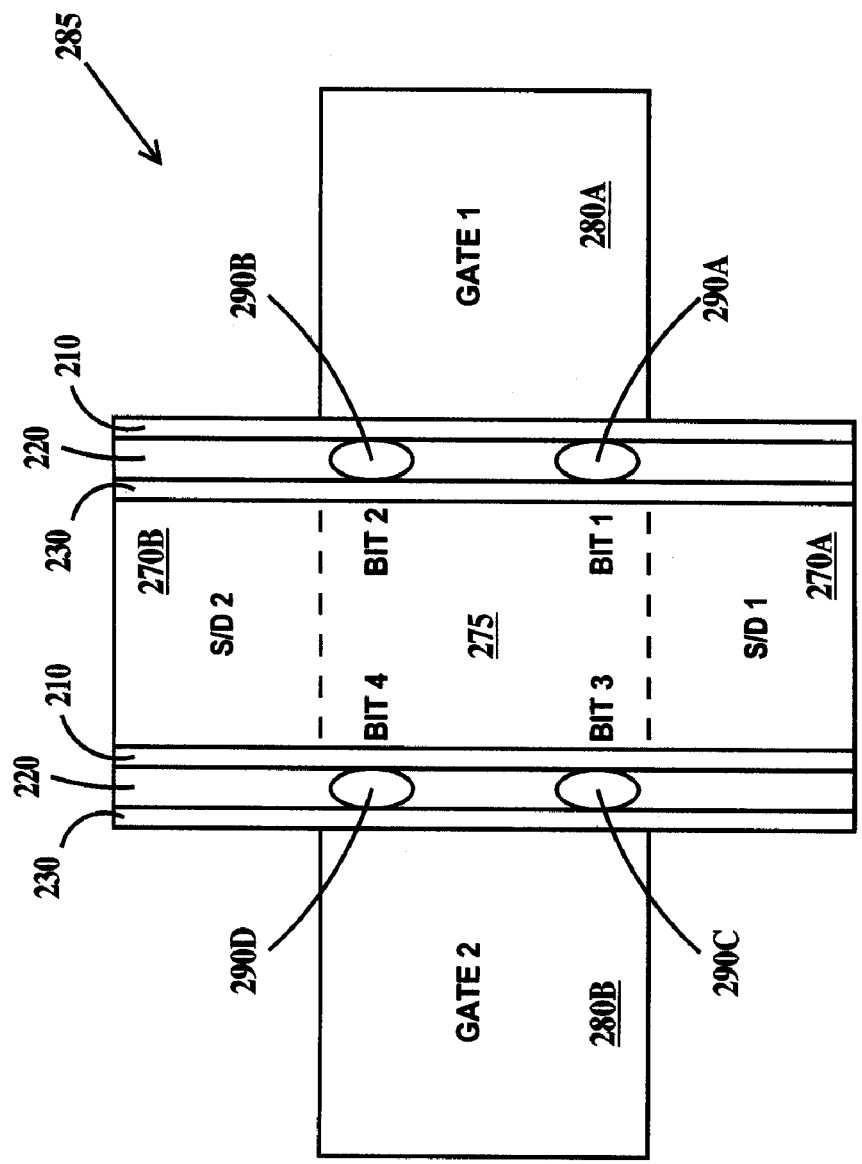
FIG. 11 is a plan view through section line 11 of FIG. 10, illustrating the bit storage locations of the four-bit FinFET device of the present invention.

FIG. 11 is a plan view through section line 11 of FIG. 10, illustrating the bit storage locations of the four-bit FinFET device of the present invention. In FIG. 11, four-bit FinFET 285 includes opposing first gate electrode 280A (GATE 1), second gate electrode 280B (GATE 2), first S/D regions 270A (S/D1) second S/D region 270B (S/D2) and channel region 275. A first charge storage region 290A (BIT 1) is located in second dielectric layer 220 between first gate electrode 280A (GATE 1) and channel 275 and adjacent to first S/D region 270A (S/D1). A second charge storage region 290B (BIT 2) is located in second dielectric layer 220 between first gate 280A (GATE 1) and channel 275 and adjacent to second S/D 270B (S/D 2). A third charge storage region 290C (BIT 3) is located in second dielectric layer 220 between second gate electrode 280B (GATE 2) and channel 275 and adjacent to first S/D region (S/D 1). A fourth charge storage region 290D (BIT 4) is located in second dielectric layer 220 between second gate electrode 280B (GATE 2) and channel 275 and adjacent to second S/D region 270B (S/D 2).

Four-bits of data may be independently written to or read from BIT 1, BIT 2, BIT 3 and BIT 4 by application of the voltages at the levels indicated to GATE 1, GATE 2, S/D 1 and S/D 2 as illustrated in Table I. To write a bit means to place charge on the bit. The charge written may be positive or negative. However, BIT 1, BIT 2, BIT 3 and BIT 4 must be erased at the same time. To erase a bit means to remove the charge that was written and return the bit to an uncharged state. Prior to erasing BIT 1, BIT 2, BIT 3 and BIT 4, any unwritten BIT may be written to so that no uncharged bits are subject to over-erasing which could result in low charge levels of the bit upon the next write cycle.

The voltages listed in Table I are suitable for a FinNFET storing negative charge (electrons) in the bit locations and having a first or tunneling gate dielectric layer comprising silicon dioxide about 70 Å thick, a second gate dielectric layer comprising silicon nitride about 150 Å thick and a third gate dielectric comprising silicon dioxide about 50 Å thick.

TABLE I

| OPERATION | GATE 1 VOLTAGE | GATE 2 VOLTAGE | S/D 1 VOLTAGE | S/D 2 VOLTAGE |
| --- | --- | --- | --- | --- |
| WRITE BIT 1 | 6 V | 2.5 V | 5 V | 0 V |
| READ BIT 1 | 2.5 V | 0 V | 0 V | 0.5 V |
| WRITE BIT 2 | 6 V | 2.5 V | 0 V | 5 V |
| READ BIT 2 | 2.5 V | 0 V | 0.5 V | 0 V |
| WRITE BIT 3 | 2.5 V | 6 V | 5 V | 0 V |
| READ BIT 3 | 0 V | 2.5 V | 0 V | 0.5 V |
| WRITE BIT 4 | 2.5 V | 6 V | 0 V | 5 V |
| READ BIT 4 | 0 V | 2.5 V | 0.5 V | 0 V |
| ERASE BITS | −6 V | −6 V | 5.5 V | 5.5 V |

FinFET 285 is suitable for use as a memory cell in a non-volatile random access memory (NVRAM). Examples of NVRAM include FLASH, electrically erasable reprogrammable read only memory (EEPROM) and electrically programmable read-only memory (EPROM).

Figure 12A:
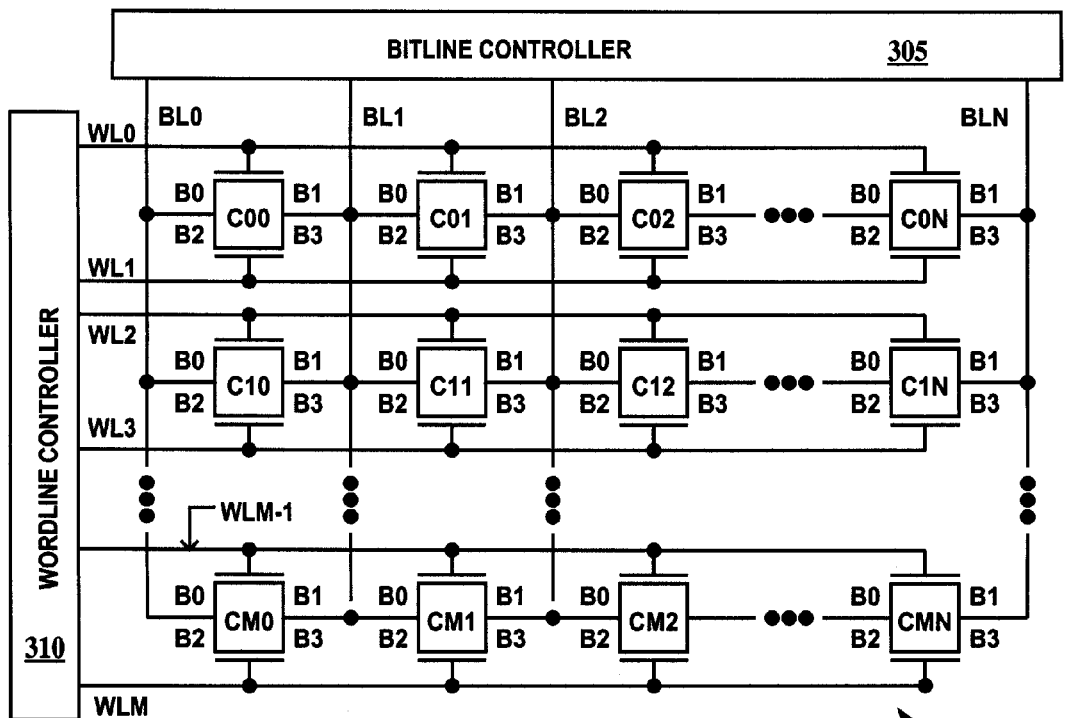
FIG. 12A is schematic diagram of a Non-Volatile Random Access Memory (NVRAM) according to the present invention.

FIG. 12A is schematic diagram of a NVRAM according to the present invention. In FIG. 12A a NVRAM 300 includes an N by M array of four 4-bit NVRAM memory cells C00–CMN of M rows and N columns. Each four-bit NVRAM memory cell C00–CMN includes a FINFET 285 as illustrated in FIGS. 10 and 11 supra. NVRAM 300 includes a bitline controller 305 and a wordline controller 305 that decode I/Os during various operations that are performed on NVRAM 300 (e.g., operations such as programming, reading, verifying, erasing). Bitline controller 305 and wordline controller 310 receive address bus information from a system controller (not shown) or the like. A common wordline is attached to the gate of each cell in a row, such as wordlines WL0, WL1, WL2, through WLM. A common bitline is attached to each bit of a cell in a column, such as bitlines BL0, BL1, BL2 through BLN.

Figure 12B:
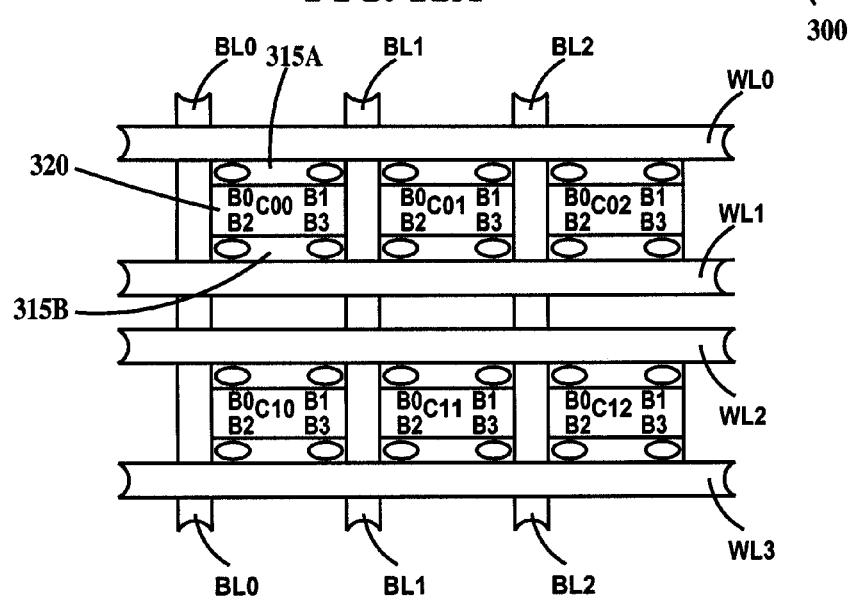
FIG. 12B is a physical layout of a portion of the NVRAM of FIG. 12B.

In FIG. 12A it can be seen that a first set of two of the four bits of each cell are connected to a first wordline and a second set of two of the four bits (different from the two bits of the first set) are connected to a second wordline. For example, in cell C00, bit B0 and B1 are connected to wordline WL0 and bits B2 and B3 are connected to WL1. It can also be seen that one bit of each cell are connected to a first bitline and the other bit of each cell is connected to a second bitline. For example, in cell C00, bit B0 and B21 are connected to wordline BWL0 and bits B1 and B3 are connected to BL1. Physically, it is important to distinguish between bits as illustrated in FIG. 12B and described infra.

Table II illustrates one particular set of voltage parameters for performing reading, programming and single sided erases of the four-bit memory cell C00 having a first bit C0, a second bit B1, a third bit B2 and a fourth bit B3.

TABLE II

| OPERATION | GATE VOLTAGE WL0 | GATE VOLTAGE WL1 | BITLINE 0 VOLTAGE | BITLINE 1 VOLTAGE | COMMENT |
|---|---|---|---|---|---|
| READ BIT B0 | 2.5 V | 0 V | 0 V | 0.5 V | |
| READ BIT B1 | 2.5 V | 0 V | 0.5 V | 0 V | |
| READ BIT B2 | 0 V | 2.5 V | 0 V | 0.5 V | |
| READ BIT B3 | 0 V | 2.5 V | 0.5 V | 0 V | |
| WRITE BIT B0 | 6 V | 2.5 V | 5 V | 0 V | Hot Electron |
| WRITE BIT B1 | 6 V | 2.5 V | 0 V | 5 V | Hot Electron |
| WRITE BIT B2 | 2.5 V | 6 V | 5 V | 0 V | Hot Electron |
| WRITE BIT B3 | 2.5 V | 6 V | 0 V | 5 V | Hot Electron |
| ERASE BIT B0 | −6 V | 0 V | 5.5 V | Float | Hot Hole |
| ERASE BIT B1 | −6 V | 0 V | Float | 5.5 V | Hot Hole |
| ERASE BIT B2 | 0 V | −6 V | 5.5 V | Float | Hot Hole |
| ERASE BIT B3 | 0 V | −6 V | Float | 5.5 V | Hot Hole |
| ERASE BITS B0 & B1 | −6 V | 0 V | 5.5 V | 5.5 V | |
| ERASE BITS B2 & B3 | 0 V | −6 V | 5.5 V | 5.5 V | |

FIG. 12B is a physical layout of a portion of the NVRAM of FIG. 12B. In FIG. four-bit memory cells C00, C01, C02, C10, C11 and C12, bitlines BL0, BL1 and BL3, and wordlines WL0, WL2, WL3 and WL4 are illustrated. Using 4-bit memory cell C00 as an example, it can be seen that bits B0 and B1 are stored in a dielectric layer 315A on a first side of a fin body 320 and bits B1 and B3 are stored in a dielectric layer 315B on a second and opposite side of the fin body. WL0 forms a common gate for bits B0 and B1 and WL1 forms a common gate for bits B2 and B3. Bitline BL0 forms a common source for bits B0 and B2 and bitline BL1 forms a common drain for bits B1 and B3. It should be noted that bitline BL1 also forms a common source for Bits B0 and B2 of adjacent four-bit memory cell C01. It is a feature of the present invention that the drain of two bits in a first four-bit cell is also the source of two bits in the adjacent four-bit cell second between each pair of wordlines acting a pair of common gates for those four-bit cells.

Thus, the present invention provides a device with both increased device density and increased bit counts per memory cell device at the same time.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device, comprising:
   a fin body having opposite first and second ends and opposite first and second sidewalls, said first and second sidewalls disposed between said first and second ends;
   a first gate dielectric stack disposed on said first sidewall and a second gate dielectric stack disposed on said second sidewall, said first and second stacks each comprising at least a first, a second and a third dielectric layer, said first dielectric layer of said first dielectric stack in direct physical contact with said first sidewall and said first dielectric layer of said second dielectric stack in direct physical contact with said second sidewall;
   a first gate electrode in direct physical contact with said third dielectric layer of said first gate dielectric stack and a second gate electrode in direct physical contact with said third dielectric layer of said second gate dielectric stack, said first and second gate electrodes not in direct physical contact with each other;
   a first source/drain in said first end of said fin body and a second source/drain in said second end of said fin body; and
   a channel region in said fin body between said first and second source/drains and aligned between said first and second gate electrodes.

2. The semiconductor device of claim 1, wherein:
   said second dielectric layers of said first and said second gate dielectric stacks are a same second layer; and
   said third dielectric layers of said first and said second gate dielectric stacks are a same third layer.

3. The semiconductor device of claim 1, wherein:
   said first dielectric layers of said first and said second gate dielectric stacks are a same first layer.

4. The semiconductor device of claim 1, wherein said first dielectric layers of said first and second gate stacks comprise silicon dioxide, said second dielectric layers of said first and second gate stacks comprise silicon nitride, and said third dielectric layers of said first and second gate stacks comprise silicon dioxide.

5. The semiconductor device of claim 1, wherein said first dielectric layers of said first and second gate stacks comprise a material selected from the group consisting of metal oxides, $Ta_2O_5$, $BaTiO_3$, $HfO_2$, $ZrO_2$, $Al_2O_3$, metal silicates, $HfSi_xO_y$, $HfSi_xO_yN_z$, silicon dioxide and combinations thereof.

6. The semiconductor device of claim 1, wherein said channel region of said fin body is intrinsic or doped P-type and said first and second source/drains are doped N-type.

7. The semiconductor device of claim 6, wherein said first and second gate electrodes are intrinsic or doped N-type.

8. The semiconductor device of claim 1, wherein said channel region of said fin body is intrinsic or doped N-type and said first and second source/drains are doped P-type.

9. The semiconductor device of claim 8, wherein said first and second gate electrodes are intrinsic or doped P-type.

10. The semiconductor device of claim 1, wherein said first and second gate electrodes comprise polysilicon.

11. The semiconductor device of claim 1, wherein said fin body comprises single-crystal silicon.

12. The semiconductor device of claim 1, further including:
 a first charge storage region of said second dielectric layer of said first gate dielectric stack disposed adjacent to both said first gate electrode and said first source/drain;
 a second charge storage region of said second dielectric layer of said first gate dielectric stack disposed adjacent to both said first gate electrode and said second source/drain;
 a third charge storage region of said second dielectric layer of said second gate dielectric stack disposed adjacent to both said second gate electrode and said first source/drain; and
 a fourth charge storage region of said second dielectric layer of said second gate dielectric stack disposed adjacent to both said second gate electrode and said second source/drain.

13. The semiconductor device of claim 1, wherein said first and second gate electrodes are connected to wordlines of an NVRAM memory cell and said first and second source/drains are connected to bitlines of said NVRAM memory cell.

14. An NVRAM memory, comprising:
 an array of four-bit memory cells arranged in rows and columns, each 4-bit memory cell comprising:
 a fin body having opposite first and second ends and opposite first and second sidewalls, said first and second sidewalls disposed between said first and second ends;
 a first gate dielectric stack disposed on said first sidewall and a second gate dielectric stack disposed on said second sidewall, said first and second stacks each comprising at least a first, a second and a third dielectric layer, said first dielectric layer of said first dielectric stack in direct physical contact with said first sidewall and said first dielectric layer of said second dielectric stack in direct physical contact with said second sidewall;
 a first gate electrode in direct physical contact with said third dielectric layer of said first gate dielectric stack and a second gate electrode in direct physical contact with said third dielectric layer of said second gate dielectric stack, said first and second gate electrodes not in direct physical contact with each other;
 a first source/drain in said first end of said fin body and a second source/drain in said second end of said fin body; and
 a channel region in said fin body between said first and second source/drains and aligned between said first and second gate electrodes;
 a first wordline connected to each first gate electrode and a second wordline connected to each second gate electrode of each four-bit memory cell in a same row of four-bit memory cells of said array of four-bit memory cells; and
 a first bitline connected to each first source/drain and a second bitline connected to each second source/drain of each four-bit memory cell in a same column of four-bit memory cells of said array of four-bit memory cells.

15. The NVRAM memory of claim 14, further including:
 a first charge storage region of said second dielectric layer of said first gate dielectric stack disposed adjacent to both said first gate electrode and said first source/drain;
 a second charge storage region of said second dielectric layer of said first gate dielectric stack disposed adjacent to both said first gate electrode and said second source/drain;
 a third charge storage region of said second dielectric layer of said second gate dielectric stack disposed adjacent to both said second gate electrode and said first source/drain; and
 a fourth charge storage region of said second dielectric layer of said second gate dielectric stack disposed adjacent to both said second gate electrode and said second source/drain.

16. The NVRAM memory of claim 14, wherein a second source/drain of a first four-bit memory cell of said array of four-bit memory cells is connected to a same bitline as a first source/drain of a second four-bit memory cell of said array of four-bit memory cells.

17. The NVRAM of claim 16, wherein said second source/drain of said first four-bit memory cell of said array of four-bit memory cells and said second four-bit memory cell of said array of four-bit memory cells are in adjacent columns of said array of four-bit memory cells.

18. The NVRAM memory of claim 14, wherein said first four-bit memory cell of said array of four-bit memory cells and said second four-bit memory cell of said array of four-bit memory cells are connected to a pair of adjacent wordlines.

19. The NVRAM memory of claim 14, wherein said each channel region of each fin body of each four-bit memory cell of said array of four-bit memory cells is intrinsic or doped P-type and each first source/drain and each second source/drain of each four-bit memory cell of said array of four-bit memory cells are doped N-type.

20. The NVRAM memory of claim 14, wherein said each channel region of each fin body of each four-bit memory cell of said array of four-bit memory cells is intrinsic or doped N-type and each first source/drain and each second source/drain of each four-bit memory cell of said array of four-bit memory cells are doped P-type.

21. The NVRAM memory of claim 14, wherein each first gate and each second gate electrode of each fin body of each four-bit memory cell of said array of four-bit memory cells comprise polysilicon.

22. The NVRAM memory of claim 14, wherein each fin body of each fin body of each four-bit memory cell of said array of four-bit memory cells comprise single-crystal silicon.

* * * * *

UNITED STATES PATENT AND TRADEMARK OFFICE
CERTIFICATE OF CORRECTION

PATENT NO. : 7,091,551 B1  Page 1 of 1
APPLICATION NO. : 10/907712
DATED : August 15, 2006
INVENTOR(S) : Anderson et al.

It is certified that error appears in the above-identified patent and that said Letters Patent is hereby corrected as shown below:

<u>Column 4</u>
Line 34, delete "the"

<u>Column 10</u>
Line 50, delete "of each fin body"

Signed and Sealed this

Twelfth Day of December, 2006

JON W. DUDAS
*Director of the United States Patent and Trademark Office*